United States Patent
Sturrock et al.

(10) Patent No.: US 7,801,710 B2
(45) Date of Patent: Sep. 21, 2010

(54) SIMULATION CONTROLS FOR MODEL VARIABILITY AND RANDOMNESS

(75) Inventors: David T. Sturrock, Evans City, PA (US); Richard A. Morse, Hudson, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 285 days.

(21) Appl. No.: 11/864,685

(22) Filed: Sep. 28, 2007

(65) Prior Publication Data

US 2009/0089027 A1  Apr. 2, 2009

(51) Int. Cl.
- G06F 17/50  (2006.01)
- G06F 13/00  (2006.01)

(52) U.S. Cl. .......... 703/2; 703/5; 703/22; 711/163; 717/106; 717/135

(58) Field of Classification Search ........... 703/22–24, 703/2, 5; 711/163; 717/106, 135
See application file for complete search history.

(56) References Cited

U.S. PATENT DOCUMENTS

| | | | |
|---|---|---|---|
| 4,167,821 A | 9/1979 | Gibson, Jr. et al. | |
| 4,385,349 A | 5/1983 | Ashford et al. | |
| 4,613,952 A | 9/1986 | McClanahan | |
| 4,630,189 A | 12/1986 | Ohmori et al. | |
| 4,755,925 A | 7/1988 | Tsuchiya et al. | |
| 5,375,448 A | 12/1994 | Katayama et al. | |
| 5,394,322 A | 2/1995 | Hansen | |
| 5,402,333 A | 3/1995 | Cardner | |
| 5,436,855 A | 7/1995 | Willafys et al. | |
| 5,455,763 A | 10/1995 | Feingold | |
| 5,727,128 A | 3/1998 | Morrison | |
| 5,848,393 A | 12/1998 | Goodridge et al. | |
| 5,997,167 A | 12/1999 | Crater et al. | |
| 6,088,689 A | 7/2000 | Kohn et al. | |
| 6,108,662 A | 8/2000 | Hoskins et al. | |
| 6,112,312 A | 8/2000 | Parker et al. | |
| 6,353,904 B1 | 3/2002 | Le | |
| 6,529,780 B1 | 3/2003 | Soergel et al. | |
| 6,802,045 B1 | 10/2004 | Sonderman et al. | |
| 6,826,518 B1 | 11/2004 | Ivezic et al. | |
| 6,868,373 B2 | 3/2005 | Fehn | |
| 6,901,308 B1 | 5/2005 | Hamada et al. | |
| 6,941,249 B1 | 9/2005 | Miller et al. | |
| 6,985,779 B2 | 1/2006 | Hsiung et al. | |
| 7,010,364 B1 | 3/2006 | Singh et al. | |
| 7,082,348 B1 | 7/2006 | Dahlquist et al. | |
| 7,110,929 B1 | 9/2006 | Meares | |

(Continued)

OTHER PUBLICATIONS

OA mailed Dec. 10, 2010 for U.S. Appl. No. 11/864,693, 15 pages.

(Continued)

*Primary Examiner*—Thai Phan
(74) *Attorney, Agent, or Firm*—Turocy & Watson LLP; Alexander R. Kuszewski; John M. Miller

(57) ABSTRACT

A tool for simulating an industrial control system is provided. The tool includes a simulation component to emulate one or more simulation models according to a simulated execution environment. A switch component is associated with the simulation component to selectively enable or disable variability in the simulation models.

19 Claims, 10 Drawing Sheets

U.S. PATENT DOCUMENTS

| | | | |
|---|---|---|---|
| 7,117,261 B2 | 10/2006 | Kryskow et al. | |
| 7,136,716 B2 | 11/2006 | Hsiung et al. | |
| 7,218,974 B2 | 5/2007 | Rumi et al. | |
| 7,239,991 B2 | 7/2007 | Tuszynski | |
| 7,257,451 B2 | 8/2007 | Carpency et al. | |
| 7,546,602 B2 * | 6/2009 | Hejlsberg et al. | 719/313 |
| 2001/0056339 A1 | 12/2001 | Robinson et al. | |
| 2002/0091990 A1 | 7/2002 | Little et al. | |
| 2002/0120352 A1 | 8/2002 | Stothert et al. | |
| 2003/0061004 A1 | 3/2003 | Discenzo | |
| 2003/0079207 A1 * | 4/2003 | Xavier et al. | 717/135 |
| 2003/0167454 A1 | 9/2003 | Iordanov et al. | |
| 2004/0034555 A1 | 2/2004 | Dismukes et al. | |
| 2004/0049295 A1 | 3/2004 | Wojsznis et al. | |
| 2004/0064253 A1 | 4/2004 | Brayton et al. | |
| 2004/0102940 A1 | 5/2004 | Lendermann et al. | |
| 2004/0114609 A1 * | 6/2004 | Swarbrick et al. | 370/400 |
| 2004/0153437 A1 | 8/2004 | Buchan | |
| 2004/0199360 A1 | 10/2004 | Friman et al. | |
| 2005/0071139 A1 | 3/2005 | Patwardhan et al. | |
| 2005/0125629 A1 * | 6/2005 | Kissell | 712/1 |
| 2005/0154476 A1 | 7/2005 | Gallestey et al. | |
| 2005/0246712 A1 * | 11/2005 | Ferris | 719/310 |
| 2005/0249196 A1 * | 11/2005 | Ansari et al. | 370/352 |
| 2005/0256692 A1 | 11/2005 | Monin et al. | |
| 2005/0273305 A1 | 12/2005 | Thalhammer-Reyero | |
| 2006/0058976 A1 | 3/2006 | Ferris | |
| 2006/0149582 A1 | 7/2006 | Hawkins | |
| 2006/0167667 A1 | 7/2006 | Maturana et al. | |
| 2006/0174221 A1 * | 8/2006 | Kinsella et al. | 717/106 |
| 2006/0277016 A1 | 12/2006 | Kouchi et al. | |
| 2007/0022402 A1 | 1/2007 | Ye et al. | |
| 2007/0124461 A1 | 5/2007 | Kryskow et al. | |
| 2007/0277151 A1 | 11/2007 | Brunel et al. | |
| 2007/0294496 A1 * | 12/2007 | Goss et al. | 711/163 |
| 2008/0066004 A1 | 3/2008 | Blevins et al. | |
| 2008/0281824 A1 | 11/2008 | Rangadass et al. | |
| 2009/0254572 A1 | 10/2009 | Redlich et al. | |

OTHER PUBLICATIONS

OA mailed Jun. 9, 2010 for U.S. Appl. No. 11/864,701.
OA mailed May 28, 2010 for U.S. Appl. No. 11/864,620.

* cited by examiner

SIMULATION CONTROLS FOR MODEL VARIABILITY AND RANDOMNESS

TECHNICAL FIELD

The claimed subject matter relates generally to industrial control systems and more particularly to simulator tools that allow variability to be selectively enabled or disabled in models to facilitate simulation testing.

BACKGROUND

Simulation and modeling for automation has advanced considerably in recent years. In one instance, manufacturers employ simulation for business purposes. While some have utilized simulation to close sales with suppliers, other manufacturers employ simulation for supply chain planning. For example, if it is known how many items are produced for a given line, then it can be determined where production needs to occur and what equipment needs to drive the production while yielding confidence in the final production outcome. Entities can also predict delivery schedules from simulations. Design engineers are using simulation to alter their designs to make products easier to manufacture, whereas many companies are now creating simulations of entire plants before a plant is built or refurbished.

One recent trend is the use of simulation to train plant personnel. There are two main areas where simulation has helped in training. In one, simulation allows less skilled workers to practice and gain experience "operating" plant equipment before taking the reins in the real world. In another, simulated operation offers an accelerated form of training. For instance, input/output (I/O) simulation software provides a shortcut to training on actual equipment that may not even be available at the present time, where training materials can be created from simulated manufacturing design. Training is often considered a secondary use of simulation, but the savings it produces can be considerable nonetheless. Another recent development in simulation mirrors progress in other areas of computer technology: standardization of data. One of the trends in simulation is the ability to share data. Thus, users share data in many directions, from product design and manufacturing to robot simulation and ergonomics, for example.

Three-dimensional modeling has gained ground in manufacturing simulation. Three-dimensional modeling first was applied in the aerospace and automotive sectors. Often, designers model robots in 3-D, then select the location for the respective operation such as "weld" and instruct the robot to perform along those lines. As for parameters such as pressure and the robot's maneuverability, such parameters can be built into the simulation and delivered by the robot manufacturer, thus preventing a simulation from inadvertently instructing the robot to perform an operation that is beyond its capabilities. Often times the robots are controlled from one or more programmable controllers that can also be simulated.

When a company has its manufacturing process fully simulated, it becomes easier to analyze a product design and observe how well it performs in a manufacturing setting. Since the design and manufacturing are not yet "live," there is an opportunity to turn back to the design engineer and request changes before it is cost prohibitive to do so. Such changes at the simulation stage are generally much less costly to implement than at the actual manufacturing stage. Thus, early on in the life of the product, designers can analyze the simulated manufacturing process, and adjust a given product for desired manufacturability. The ability to alter a product design prior to manufacturing in order to cause the entire process to work more efficiently offers significant potential savings over the traditional design process. This process is often referred to as front-loading, where a designer can identify manufacturing glitches through simulation and then facilitate planning on how to overcome such problems. With front-loading, products can be designed so it performs well in the manufacturing simulation which should mitigate problems in actual production thus mitigating overall system costs.

Simulation can also be implemented end-to-end, thus demonstrating how every process in a plant performs together over a designated period of time. For instance, simulation can occur from the controller level up to warehouse management and other supervisory systems. One area where simulations of the entire plant are taking hold is with new plants or newly refitted plants. Before manufacturers determine what equipment they need and where it should go, they simulate the plant's entire operations. Dynamic simulation thus provides a model for a new plant to ensure the plant is designed properly.

Current simulation tools for industrial control systems provide the ability to model components of the systems such as modeling controller execution times. This may include modeling communications with modules such as I/O modules that communicate with the industrial controller systems such as over a network or backplane. The models that provide the basis for emulating such systems and models are quite complex however and may take considerable time to execute. This type of model behavior may not always be necessary however especially when performing initial testing to rapidly determine viability of a complex system.

SUMMARY OF THE INVENTION

The following summary presents a simplified overview of the invention to provide a basic understanding of certain aspects of the invention. This summary is not an extensive overview of the invention. Nor is the summary intended to identify critical elements of the invention or delineate the scope of the invention. The sole purpose of this summary is to present some features offered by the invention in a simplified form as a prelude to a more detailed description presented later.

Simulation controls are provided to enable simulation tools to selectively enable or disable model capabilities in order to facilitate various applications. Such capabilities relate to model variability and randomness features that may not be necessary (in whole or in part) in some applications. Rather than merely shutting off variability, expressions can be created to allow modifications of returned parameters when model variability has been disabled. In one aspect, an option can be provided to allow variability to be disabled via dialog interfaces or programmatically through simulation instructions. Display interface options such as selection boxes provide a specific level of activation for such controls. Also a user variable can be generated that can be tested at runtime to determine if variability is enabled. Each of various random distributions can react to "variability disabled" by returning a calculated mean of the distribution (in most cases a parameter of the distribution). Suitable actions for special cases can be provided and evaluated including failure considerations, branch block instructions, and schedules (e.g., possibly disable failures entirely, always pick the first or middle branch, and remove any randomness from schedules). Enhanced capability can be provided by allowing the ability to customize behaviors. One example is to allow failures to be converted to fixed (mean) failure intervals rather than disabling them entirely. Another example is to provide options of what to return from distributions (e.g., possibly return a factor of the mean to cause the behavior to be more or less optimistic than a "mean-based" evaluation).

To the accomplishment of the foregoing and related ends, the following description and annexed drawings set forth in detail certain illustrative aspects of the invention. These aspects are indicative of but a few of the various ways in which the principles of the invention may be employed. Other advantages and novel features of the invention may become apparent from the following detailed description of the invention when considered in conjunction with the drawings.

DETAILED DESCRIPTION OF THE INVENTION

An integrated solution for simulating control systems and related devices is provided. In one aspect, a tool for simulating an industrial control system is provided. The tool includes a simulation component to emulate one or more simulation models according to a simulated execution environment. A switch component is associated with the simulation component to selectively enable or disable variability in the simulation models.

It is noted that as used in this application, terms such as "component," "module," "model," and the like are intended to refer to a computer-related entity, either hardware, a combination of hardware and software, software, or software in execution as applied to an automation system for industrial control. For example, a component may be, but is not limited to being, a process running on a processor, a processor, an object, an executable, a thread of execution, a program and a computer. By way of illustration, both an application running on a server and the server can be components. One or more components may reside within a process or thread of execution and a component may be localized on one computer or distributed between two or more computers, industrial controllers, or modules communicating therewith.

Figure 1:
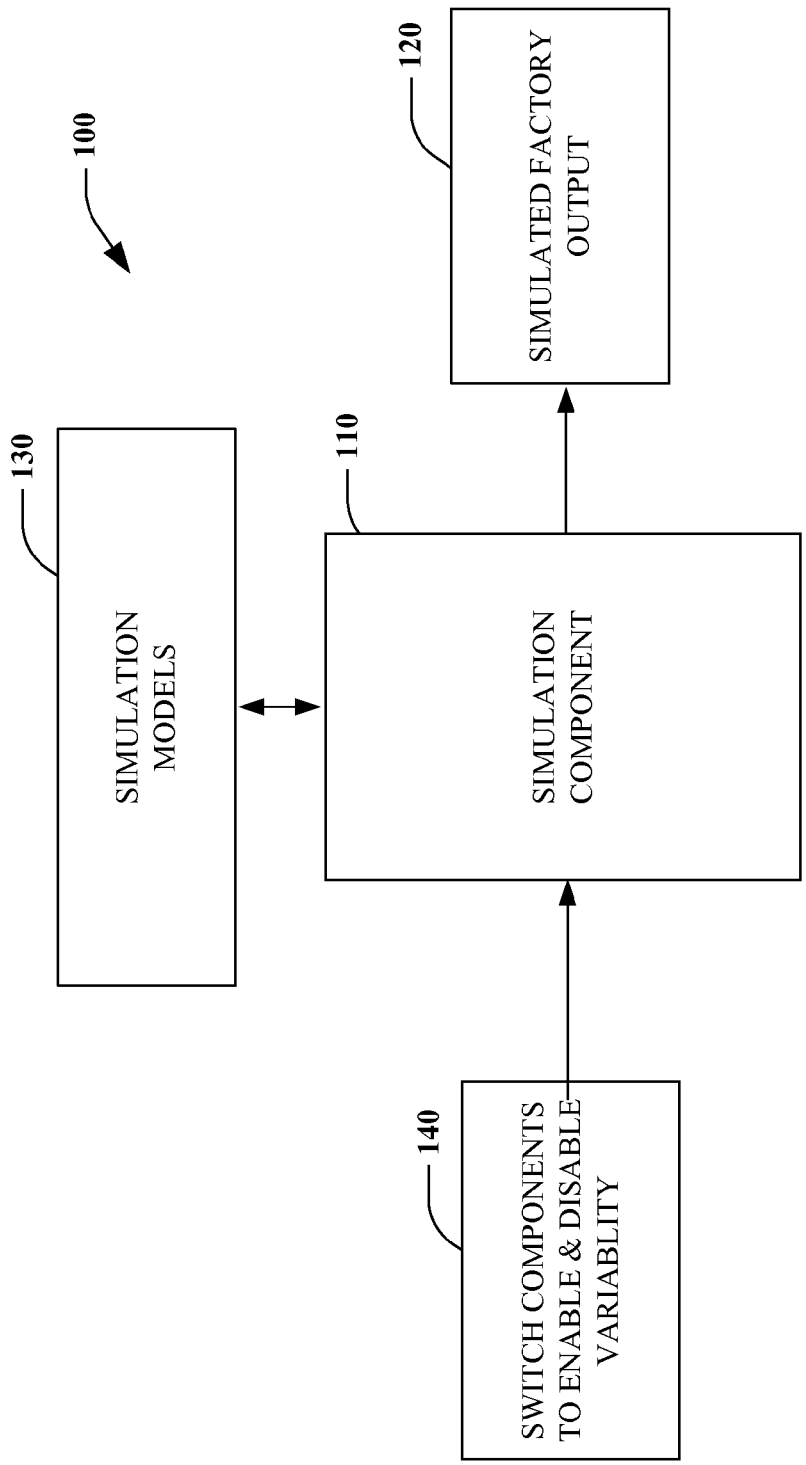
FIG. 1 is a schematic block diagram illustrating a simulation tool providing model switching controls for an industrial automation control system.

Referring initially to FIG. 1, a system 100 illustrates tools for simulating an industrial control system including switching controls to selectively enable or disable variability and randomness in simulation models. The system 100 includes a simulation component 110 that generates simulated factory output 120 in view of one or more simulation models 130, where such models can include controller models, device models, industry models, or manufacturing models which are described in more detail below. As shown a switching component 140 is provided as a control option for the simulation component 110. Such option allows variability or randomness in the simulation models 130 to be enabled or disabled as desired and per a given application. It is noted that as used herein, enabled or disabled can imply partially disabled or partially enabled functionality. For example, even though variability may be disabled via the switching component 140, expressions or other modification controls can be provided to influence default model return parameters when such variability is disabled.

In general, the switching component 140 allows disabling of the various types of randomness and variability present in the simulation models 130. Temporarily disabling variability is useful in testing (validating) a model's behavior because it allows model behavior to be easily predictable. Similarly, it can also be useful internally to facilitate manual and automated testing of the models 130 and other software. It is also useful in turning a stochastic model (for example one used in evaluating scheduling rules) into a deterministic model (e.g., one used in applying scheduling rules to generate a realistic short-term schedule). Thus, it is desirable that enabling/disabling variability can be implemented with minimal or no model changes. Permanently disabling variability (e.g. creation of a product in which variability cannot be enabled) provides the opportunity to create lower priced products for new markets, while minimizing potential cannibalization of existing products. In this case, it is desirable that model compatibility be maintained between components that do support variability and components that do not.

Simulation controls are provided to enable simulation tools to selectively enable or disable model capabilities in order to facilitate various applications. Such capabilities relate to model variability and randomness features that may not be necessary (in whole or in part) in some applications. Rather than merely shutting off variability, expressions can be created to allow modifications of returned parameters when model variability has been disabled. In one aspect, an option can be provided to allow variability to be disabled via dialog interfaces or programmatically through simulation instructions. Display interface options such as selection boxes provide a specific level of activation for such controls. Also a user variable can be generated that can be tested at runtime to determine if variability is enabled. Each of various random distributions can react to "variability disabled" by returning a calculated mean of the distribution (in most cases a parameter of the distribution). Suitable actions for special cases can be provided and evaluated including failure considerations, branch block instructions, and schedules (e.g., possibly disable failures entirely, always pick the first or middle branch, and remove any randomness from schedules). Enhanced capability can be provided by allowing the ability to customize behaviors. One example is to allow failures to be converted to fixed (mean) failure intervals rather than disabling them entirely. Another example is to provide options of what to return from distributions (e.g., possibly return a factor of the mean to cause the behavior to be more or less optimistic than a "mean-based" evaluation).

In one aspect, the simulation component 110 constructs and executes the simulation models 130 in accordance with the specifications set forth by the input component (e.g., user interface) as well as a cross-section of real time variables (e.g., a range of operating temperatures, variations in materials such as thickness, properties, and so forth) that inherently occur in an industrial control setting. The simulation component 110 also identifies suitable process control equipment (e.g., a batch server, a programmable logic controller, individual devices, I/O, and so forth), process control steps, or methodologies to accomplish the manufacture of a particular item. In another aspect, a simulation tool for an industrial control system is provided. This includes means for collecting data (historical database 160) relating to an industrial control system simulation or model. This also includes means for determining suggestions (collection tool 150) for the industrial control system or model and means for simulating (simulation component 110) the industrial control system or model based in part on the suggestions.

In general, the simulation component 110 processes components or methodologies and executes the simulation models 130 for the respective components or steps. The simulation models may be stored in a simulation database (not shown) that includes a history of simulations that have been previously run. It is to be noted that such simulation database may be accessed through remote connections such as the Internet. Other simulation models may be formed based on logic, historical simulation models, the user specification, or artificial intelligence. Alternatively, the simulation component 110 may prompt the user for a simulation model that is not found within the database, difficult to generate, or specific to the user.

When the simulation models 130 have been identified and gathered, the simulation component 110 executes a simulation based on the simulation models, stores and returns the result of the simulation at 120. By storing the results of the simulations, users can quickly identify failed or successful simulations, as well as simulation models that are similar to the current simulation for comparative purposes. If a problem occurs during simulation or the simulation fails, the simulation component 110 identifies the particular simulation models that were the root of the failure. In one aspect, the simulation component 110 simulates to the smallest level of granularity to facilitate the most accurate simulation possible. However, if a particular combination of simulation models has been run repeatedly, the simulation component 110 can identify this through the simulation database, notify the user that a repeated simulation has been executed, and refrain simulating that portion of the model (perhaps after prompting the user for permission).

It is noted that components (simulated or real) associated with the system 100 can include various computer or network components such as servers, clients, controllers, industrial controllers, programmable logic controllers (PLCs), communications modules, mobile computers, wireless components, control components and so forth that are capable of interacting across a network. Similarly, the term controller or PLC as used herein can include functionality that can be shared across multiple components, systems, or networks. For example, one or more controllers can communicate and cooperate with various network devices across the network. This can include substantially any type of control, communications module, computer, I/O device, sensors, Human Machine Interface (HMI) that communicate via the network that includes control, automation, or public networks. The controller can also communicate to and control various other devices such as Input/Output modules including Analog, Digital, Programmed/Intelligent I/O modules, other programmable controllers, communications modules, sensors, output devices, and the like.

The network can include public networks such as the Internet, Intranets, and automation networks such as Control and Information Protocol (CIP) networks including DeviceNet and ControlNet. Other networks include Ethernet, DH/DH+, Remote I/O, Fieldbus, Modbus, Profibus, wireless networks, serial protocols, and so forth. In addition, the network devices can include various possibilities (hardware or software components). These include components such as switches with virtual local area network (VLAN) capability, LANs, WANs, proxies, gateways, routers, firewalls, virtual private network (VPN) devices, servers, clients, computers, configuration tools, monitoring tools, or other devices.

Figure 2:
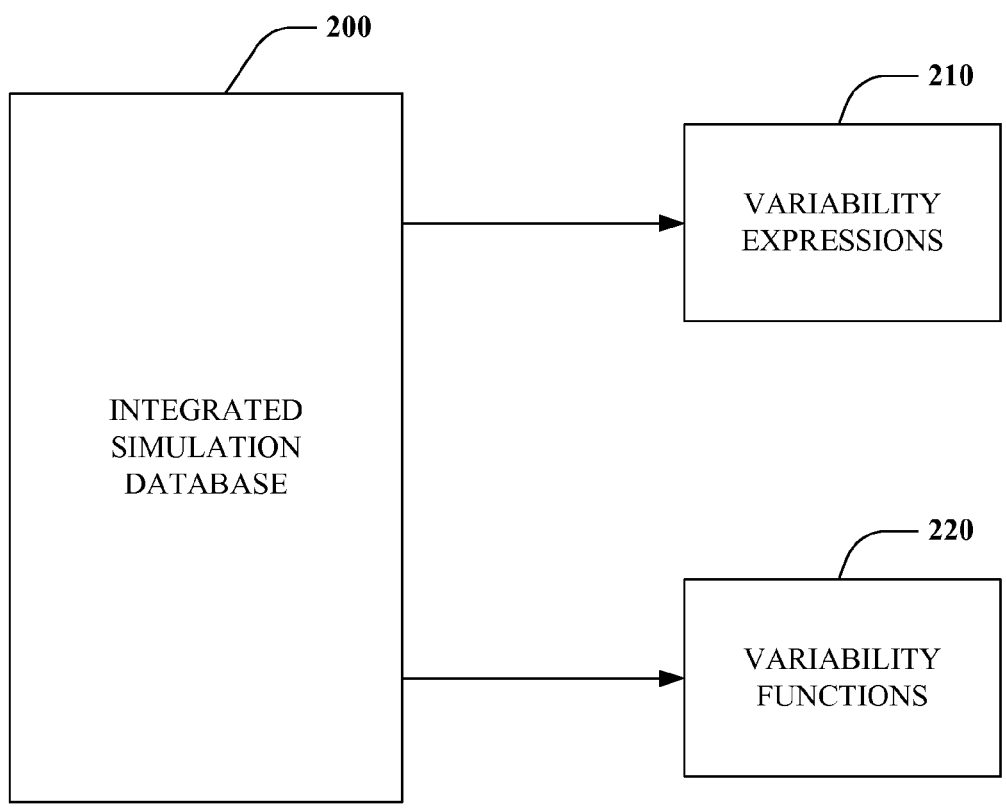
FIG. 2 is a diagram illustrating an example variability options for a simulation system.

Turning now to FIG. 2, example variability options 200 are illustrated for a simulation system. The variability options 200 provide a user variable to make it easy for users to specify "pessimism" factors when variability is disabled. For example, if a process has variability UNIFORM (10, 20) and was reflected in a delay block as:

DELAY: UNIFORM (10,20);

By default, when variability is disabled, this expression would cause a delay of 15.0. In scheduling applications however, it is typical to allow a little extra time, above the average, to make it more likely that the schedule will be acceptable for longer times (e.g., improve schedule robustness). Thus, users may want to revise their model such as in the following variability expression 210:

DELAY:UNIFORM(10,20)+(VariabilityOff*1.5);

where VariabilityOff is an example variability expression 210 and returns 1.0 when variability is turned off and the expression returns 1.5 (10%) higher than the mean. Thus, VariabilityOff would return 0.0 when variability is turned on and the expression would return the un-amended original distribution. As can be appreciated, the numeric values in these examples are exemplary in nature and a plurality of other expressions are possible.

At 220, variability functions can be provided. In this example, an acceptable alternative is to have a function instead of a variable, e.g., VariabilityFactor (Expr) which returns Expr when variability is Off and returns 1.0 when it is on. This could be used a bit more intuitively. To get the same results as above one would specify:

DELAY: UNIFORM (10,20)*VariabilityFactor (0.1). Again, a plurality of functions can be provided including any type of arithmetic, higher order mathematics such as complex equations, statistics and so forth.

Figure 3:
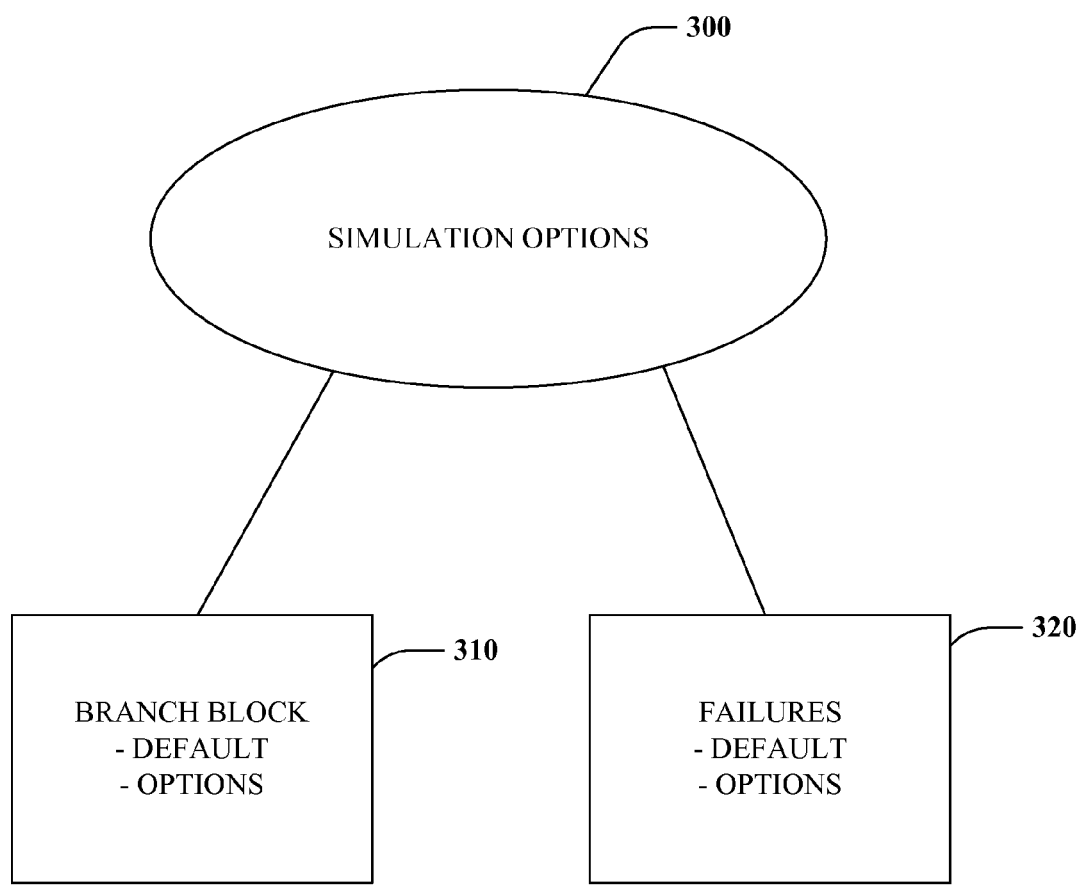
FIG. 3 is a diagram illustrating example simulation options.

Referring to FIG. 3, example simulation options 300 are illustrated that can be employed with an industrial control simulation tool. In general, if a random function returns a known quantity of 0.5 for example, various special programming situations will be acceptably processed. There are some aspects that can be more efficiently processed to allow the feature to be more intuitive and useful in more situations. For instance, if Variability as described above is optionally disabled, then users can be given the following simulation options at 310:

Branch Block:

{Default} Assume random sample of 0.5 (e.g. always select branch which encompasses 50% probability)

{Option} Select first branch encountered that references any probability.

At 320, Failures

{Default} Disable failures (e.g. treat them as if no failures were specified)

{Option} Assume random sample of 0.5 (e.g. always fail/repair at exactly MTBF and MTTR).

Figure 4:
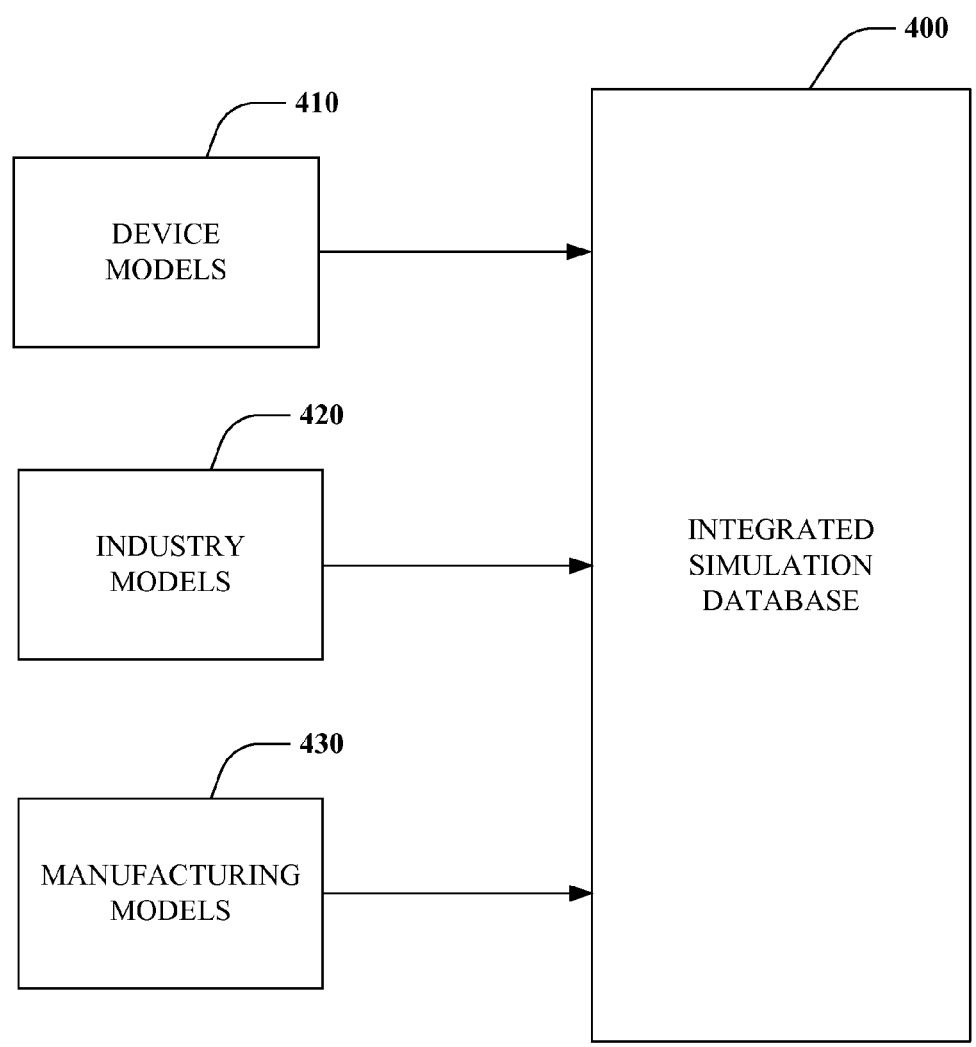
FIG. 4 is a diagram illustrating example models that can be employed with a simulation system.

Referring now to FIG. 4, example simulation models are illustrated that can be employed to drive a knowledge database 400. Device models 410 can consider different device models, device performance models, suggested device parameters, device sensor data, network parameters for a device, device operating characteristics, and alternative simulations for a device. One or more performance profiles can be included in the device profiles. This can include motor profiles having advanced acceleration or power curves that enhance the models over conventional speed profiles. Performance profiles can be associated with substantially any device that operates in a factory such as motors, drives, conveyors, and substantially any type of automated machinery. For example, advanced drive profiles can include suggested drive parameters that are selected in view of a given industry or manufacturing type described below with respect to industry and manufacturing models. Parameters can be selected based of the components that are chosen for a given simulation or selected based of desired operating goals. For instance, it may be desirable to have a range of parameters that illustrate the trade-offs between higher performance and cost in one example. Parameters can be provided and selected for a particular industry, performance, manufacturing type, or other desired outcome.

In addition to the parameters, device or sensor data can be provided that facilitates more accurate modeling and can be provided up front for a given simulation. For example, motor data can be stored with a motor model where the data has been collected or modeled from previous applications. One or more network options can be provided for a given device model 410. Such network options or parameters include data collection times, message overhead, device addressing considerations, and network control options. This can also include modeling over differing networks such as Device Networks, Control Networks, Ethernets, and other factory networks. One or more operating characteristics for a device can be modeled. This can include differing performance curves for varying conditions such as over different temperature, pressure, and humidity conditions, for example. The device models 410 can also include one or more alternative device simulations. This can include modeling more elaborate devices that may provide some desired performance aspect such as high speed operation. Other models may provide lower cost operations yet provide lower-end performance capabilities. User interfaces can be provided to illustrate or suggest trade-offs between the various models and offer predictions to overall system performance.

An industry model 420 considers various nuances of a particular industry and offers model suggestions based on such nuances. This can include considerations of an industry's type (e.g., beverage, automotive), industry parameters, industry profiles, throughput suggestions, equipment needs, communication considerations, and recommendations from knowledge databases for a given industry. Industry types can include substantially any type of automated industry such as power industries, food and beverage industries, pharmaceuticals, automotive, manufacturing sectors, oil & gas, and so forth. Other model items can be automatically modified based on the selected or determined industry type. Industry parameters are tailored from the nuances of a given industry. For example, a process industry for making a beverage may typically employ a known number of mixing stages, resident controllers, I/O modules, and devices, where the parameters can supply information or data relating to the nuances of such components.

Industry profiles can include performance data for a given industry and performance data for components that may be selected to operate in the respective industry. This can include industry templates that are generated to start an application in a given industry. One or more industry throughput suggestions can be provided for an industry via the model 420. This may show options for selecting the number of controller and I/O and what the trade-offs may be based upon such selections. Equipment needs suggest various equipment options relating to a selected or targeted industry. Communication considerations outline the various communication needs and options for a given industry. From wireless data scenarios to coupling to global systems such as the Internet, a plurality of communication configurations can be provided including how to interconnect factory networks and parameters with business networks and public networks. The knowledge database includes information gleaned from a plurality of industries which can be employed to tailor a given application. Such data can be mined for the database and employed to update the industry model 420 over time. As can be appreciated, the industry model 420 can be updated via manual or automated procedures.

A manufacturing model 430 can provide resource considerations such as tank settings, manufacturing type (e.g., discrete, process), valve settings, alarm parameters, range settings, overflow data settings, and various process settings. Manufacturing type relates to the type of manufacturing where a discrete type model is selected for assembly operations such as automotives and a processing type is selected for industries such as beverages that combine ingredients such as in a batch process. One type of example manufacturing model 430 includes one or more suggested tank settings. These can be tailored for a given industry or application and can be constructed from past experiences databases for a given industry. Similarly, one or more valve settings can be provided for a given model. This can include suggested current or voltage settings for example for controlling the valves. More sophisticated settings can include PID (proportional/integral/derivative) settings for reliable control operations for example.

The manufacturing models 430 can include one or more suggested alarm parameters. Such alarms can be typical or general alarm setting for a given industry. For example, a fill operation for a selected model tank and given fluid may be modeled as taking four minutes to fill, where the suggested alarm parameter may be four minutes and 10 seconds so as to provide a suitable buffer factor for the alarm. Possible range settings can be provided where suggested upper and lower thresholds are established for a given operation. Potential overflow data can be provided as a suggestion to potential data maximum's that can be expected for a given operation. For example, an overflow on a tank may be triggered after a certain number of gallons have been filled. One or more process settings may be related to typical operating settings for a given process. For example, a mixing operation for a powdered pharmaceutical would have different agitation properties than a mixing operation for liquid beverage. One or more miscellaneous settings can be provided that are adjusted based upon determined device, industry, or manufacturing considerations.

Figure 5:
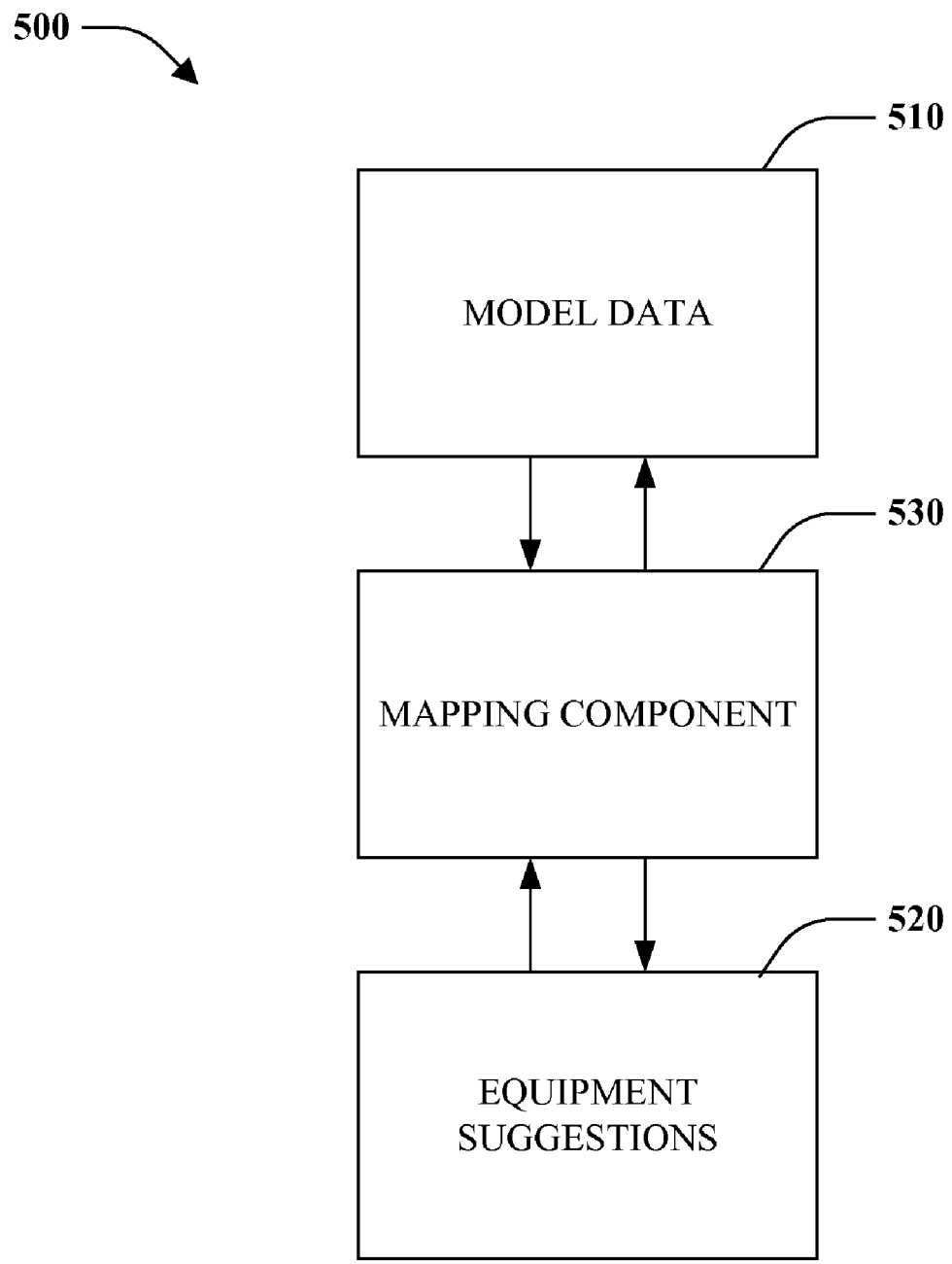
FIG. 5 is a diagram illustrating model to equipment mapping components.

FIG. 5 illustrates a system 500 that provides a model to equipment mapping. In this aspect, model data 510 is automatically transformed into one or more equipment suggestions 520 via a mapping component 530. Such mapping allows selected or suggested models to be taken from the virtual and mapped or projected onto actual equipment. For example, in a device model if a lower end motor were selected for a given conveyor application, the mapping component 530 could generate a list of potential motors that fit into the desired cost and performance criterion. Data could be provided to automatically order such equipment or how to contact a manufacturer for other data relating to equipment that has been suggested at 520. In an industry model case, factory equipment for an application can be generated in schematic form outlining the controllers utilized, I/O modules selected, devices connected to such I/O and networks capable of or suitable for handling a given application or industry. For manufacturing models, equipment such as tanks, valves, mixers, actuators, or other equipment can be mapped based off the model data 510 which is derived from the desired device, industry, or manufacturing models described above.

Figure 6:
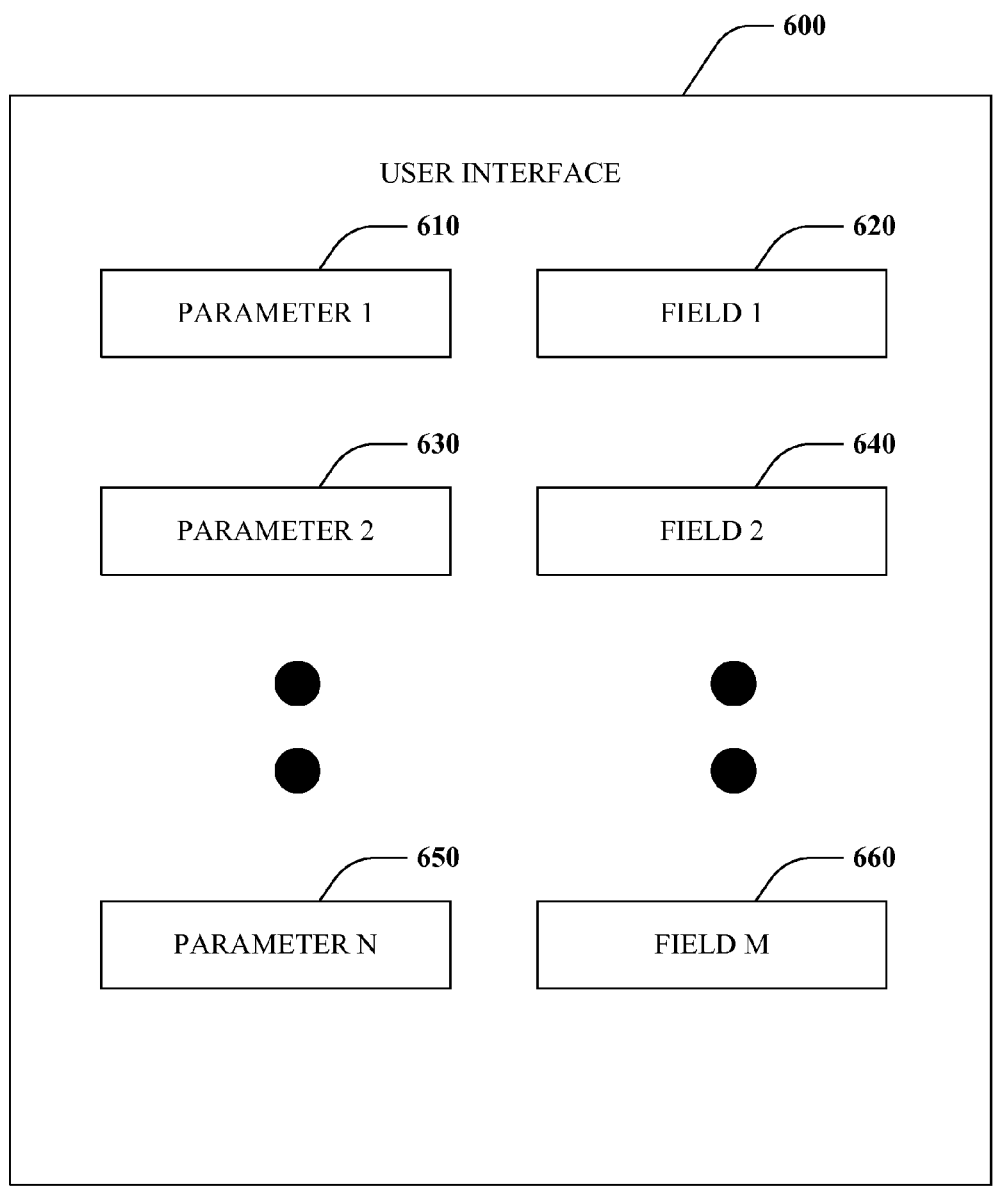
FIG. 6 is a diagram illustrating a user interface for entering simulator parameters, fields, and other simulation specifications.

Referring now to FIG. 6, a user interface 600 is provided so the user can communicate data to a simulation component described above. In one aspect, the user can specify a multitude of parameters that correspond to user desires or design goals. For example, the user could provide a plurality of goals or operating conditions in the specification that include operating temperature, a desired quantity of product to be produced per time frame, and a desired yield percentage. A parameter box 610 is provided to permit the user to label individual parameters from different portions of a specification or other type input, for example. A field box 620 is provided in the user interface 600 to enable the user to input a particular goal that corresponds to the label in parameter box 610.

Alternatively, the user interface 600 can automatically fill the parameter box labels for the user if existing parameters are commonly used. The user interface 600 can communicate with a database component (not shown) to determine possible parameters, parameter ranges, and parameter limits. Upon retrieval of the parameter data, the user interface 600 can present this information to the user in the form of a parameter box label 610 and a parameter field drop down selection box 620.

For instance, an industrial controller that controls a motor may be expected to have different operating speed settings or revolutions per minute (RPM) settings. The user interface 600 can communicate with a database component (not shown) and determine the variables that could be included as parameters such as input voltage, operating speed (RPMs), and torque. User interface 600 may determine that the motor could accept three input voltage levels: low, nominal, and high, for example. The user interface 600 may further determine that the motor outputs run at either a low or high level of torque and that it can run between five hundred and one thousand RPMs. Upon determination of the parameter data, the user interface 600 automatically labels parameter box 610 with an "Input Voltage" label and creates a drop down box in field box 620 that lists the three possible settings for the user to choose. Similarly, user interface 600 can label parameter box 630 as "Torque" and create a drop down box with the two possible settings from which the user could choose. Again, the user interface 600 can automatically label parameter box 650 as "RPM setting". In this situation, however, field box 660 may be left blank and the user interface 600 could prompt the user to input an RPM number between five hundred and one thousand.

It is to be noted that the claimed subject matter is not limited to parameters that are stored within a database. The user may input parameters that do not directly correspond to a particular component. For instance, a user could provide a parameter that recites output of one hundred units per day. The user interface 600 may facilitate the implementation of such a parameter through the determination of suitable process control equipment or processes.

Figure 7:
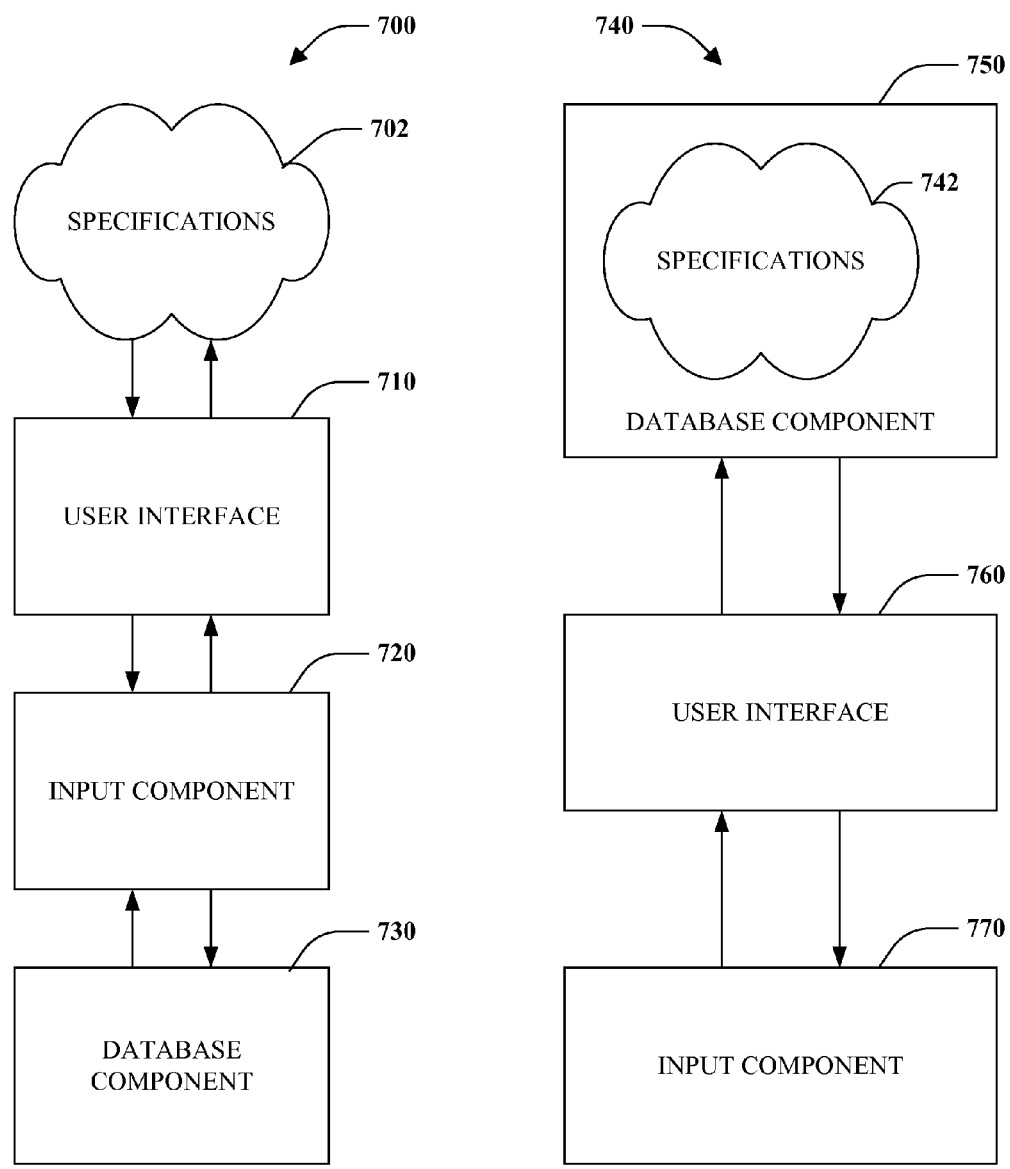
FIG. 7 is a block diagram illustrating alternative user interface aspects when interfacing to a simulation component.

Turning to FIG. 7, a system 700 illustrates gathering specifications 702 from the user through a user interface 710, communicating the specifications to an input component 720, and storing the specifications in a database component 730. Alternatively, a system 740 illustrates specifications 742 that have been entered in the past may be stored in a database component 750, presented to the user via a user interface 760, and entered into an input component 770 after selection by the user.

The input component 720, 770 accepts and stores the specifications 702, 742 from the user for later use. In one aspect, the user enters the specifications 702, 742 into a computer terminal (that represents the user interface 710, 760) with a plurality of fields that pertains to different parameters regarding the user specification. In another aspect, the user links the input component 770 to a database component 750 that houses the specifications 742 and the specifications are accessed or downloaded as the need arises. In yet another aspect, the input component 720, 770 automatically generates the specification by analyzing historical data trends or by anticipating user specifications. It is to be appreciated that data utilized to facilitate automatic generation of specification 702, 742 can be housed within database component 750 or accessed through a network such as the Internet.

The input component 720 or 770 can determine if additional specifications would be needed to facilitate simulation. If the user provides a high-level set of instructions as the specification, the input component 720, 770 can decompose the high-level specification into sub-parameters as the need arises. Decomposition can occur through a variety of techniques and the following examples are not intended to limit the scope of the subject claims. A logic component (not shown) can be used to determine suitable sub-parameters based on process control equipment to be used or processes to be provided. The database component 750 stores the results of parameter decomposition to access for later use. For example, if a controller drives a motor, and the user submits a specification that includes a parameter calling for the motor to run at one thousand RPMs and the motor uses an input voltage of 12V to do so, the input component 720, 770 can utilize logic to associate the user specification with the known properties of the motor and return the additional parameter of 12V to the user interface 710. Similarly, if the user submits a specification 702, 742 of one hundred units of production per day, the input component 720, 770 may recognize that two processes are required to complete manufacture of a unit and that each process takes twenty-four hours to complete and thus, notify the user that the specification is not feasible through the current setup due to the time limitation. If it would be possible to meet a specification through the purchase of additional manufacturing equipment, or removal of a certain limitation, the input component 720 or 770 can notify the user of such possibility.

In accordance with another aspect, the input component 720, 770 can utilize artificial intelligence component (not shown) to automatically infer parameters to suggest to the user. The artificial intelligence (AI) component can include an inference component (not shown) that can further enhance automated aspects of the AI components utilizing, in part, inference based schemes to facilitate inferring intended parameters. The AI-based aspects can be effectuated via any suitable machine learning based technique or statistical based techniques, fuzzy logic techniques, or probabilistic-based techniques. Specifically, the AI is provided to execute simulation aspects based upon AI processes (e.g., confidence, inference). For example, a process for defining a parameter can be facilitated via an automatic classifier system and process. Furthermore, the AI component can be employed to facilitate an automated process of creating a parameter in accordance with historical user trends.

Figure 8:
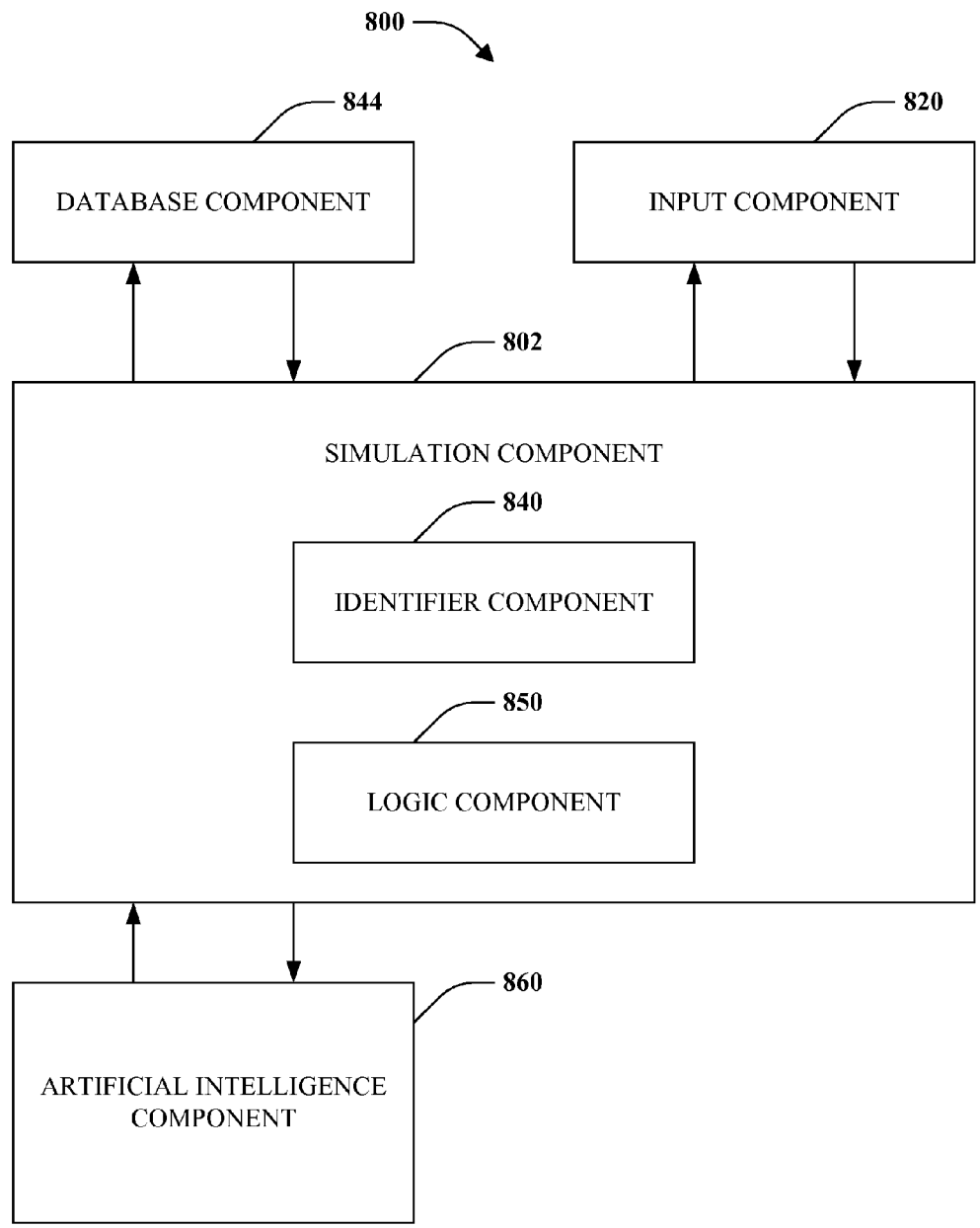
FIG. 8 is a block diagram illustrating a system employing a simulation component and alternative logic aspects.

Referring to FIG. 8, a detailed system 800 employing a simulation component 802 is illustrated. The simulation component 802 receives a set of parameters from an input component 820. As noted supra, the parameters may be derived or decomposed from a specification provided by the user and certain parameters can be inferred, suggested, or determined based on logic or artificial intelligence. An identifier component 840 identifies suitable process control equipment (e.g., a batch server, a programmable logic controller, individual devices, and so forth), process control steps, or methodologies to accomplish the manufacture of a particular item in accordance with the parameters of the specification. Identifier component 840 then associates a simulation model with one or more component or process steps. It should be appreciated that this may be performed by accessing database component 844, which stores the component and methodology simulation models.

If more than one component or process may be used to effectuate manufacture of a particular item, then the simulation component 802 employs logic component 850 to determine which component or process model to use. Logic component 850 can present business related information to the user to assist with the determination of the decision. For instance, logic component can present information to the user including cycle time for the product, costs associated with the process, level of automation of the process, or amount of waste produced, and so forth.

When the identifier component 840 has identified the components or methodologies and defined simulation models for the respective components or steps, the simulation component 802 constructs, executes, and stores simulation results based upon the simulation models identified, as well as a cross-section of real-time variables (e.g., a range of operating temperatures, variations in materials such as thickness, properties, tolerance of materials, and so forth) that inherently occur in an industrial control setting. The real-time variables are stored in the database component 844, where the simulation component 802 generates and executes a separate simulation model for a given set of conditions. If a problem occurs during simulation or the simulation fails, the simulation component 802 identifies the particular simulation models that were the root of the failure. Generally, the simulation component 802 simulates to the smallest level of granularity to facilitate the most accurate simulation possible.

The executed simulation models are then stored in database component 844 to provide a history of previously run simulation results. By storing the results of the simulations, users can quickly identify failed or successful simulations, as well as simulation models that are similar to the current simulation for comparative purposes. To streamline future access, the database component 844 associates historical simulation results with simulation model components or process steps, associated components or process steps, and specification parameters that the simulation model may have been derived from. However, if a particular combination of simulation models has been run repeatedly, the simulation component 830 can identify this through the simulation database 810, notify the user that a repeated simulation has been executed, and refrain simulating that portion of the model after prompting the user for permission. This enables users to access a simulation history efficiently and circumvent costs or inefficient use of time associated with duplicate or even substantially similar simulations. Note that if multiple manufacturing paths exist, the simulation component 802 can simulate various paths and present the user with several options.

Alternatively, the simulation component 802 may prompt the user for a simulation model that is not found within the database, difficult to generate, or specific to the user. It should be appreciated that the user may provide such simulation model through a network such as the Internet. Simulation models may also be formed based on logic or artificial intelligence. In addition to logic component 850 or in place of the logic component described with reference to the system 800, the simulation component 802 can include an artificial intelligence (AI) component 860.

In accordance with this aspect, the AI component 860 automatically generates various simulation models. For example, if manufacture of an item incorporates processes A and B, and process A comprises steps C and D, while process B comprises steps E and F, AI component 860 can generate a simulation model that incorporates C, D, E, and F or combination thereof. The AI component 860 can include an inference component (not shown) that further enhances automated aspects of the AI components utilizing, in part, inference based schemes to facilitate inferring intended simulation models. The AI-based aspects of the invention can be effected via any suitable machine learning based technique or statistical-based techniques, fuzzy logic techniques, or probabilistic-based techniques. Specifically, AI component 860 can implement simulation models based upon AI processes (e.g., confidence, inference). For example, a simulation model can be generated via an automatic classifier system and process which is described in further detail below.

A classifier is a function that maps an input attribute vector, $x=(x1, x2, x3, x4, xn)$, to a confidence that the input belongs to a class, that is, $f(x)=confidence(class)$. Such classification can employ a probabilistic or statistical-based analysis (e.g., factoring into the analysis utilities and costs) to prognose or infer an action that a user desires to be automatically performed. In the case of standing query creation and designation, for example, attributes can be file types or other data-specific attributes derived from the file types or contents, and the classes can be categories or areas of interest.

A support vector machine (SVM) is an example of a classifier that can be employed for AI. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, and probabilistic classification models providing different patterns of independence can be employed. Classification as used herein also is inclusive of statistical regression that is utilized to develop models of priority.

As will be readily appreciated from the subject specification, simulation tools can employ classifiers that are explicitly trained (e.g., via a generic training data) as well as implicitly trained (e.g., via observing user behavior, receiving extrinsic information). For example, SVM's can be configured via a learning or training phase within a classifier constructor and feature selection module. In other words, the use of expert systems, fuzzy logic, support vector machines, greedy search algorithms, rule-based systems, Bayesian models (e.g., Bayesian networks), neural networks, other non-linear training techniques, data fusion, utility-based analytical systems, systems employing Bayesian models, etc. are contemplated and are intended to fall within the scope of the hereto appended claims.

Other implementations of AI could include alternative aspects whereby based upon a learned or predicted user intention, the system can generate hierarchical notifications or prompts. Likewise, an optional AI component could generate multiple prompts to a single or group of users based upon the received content.

Figure 9:
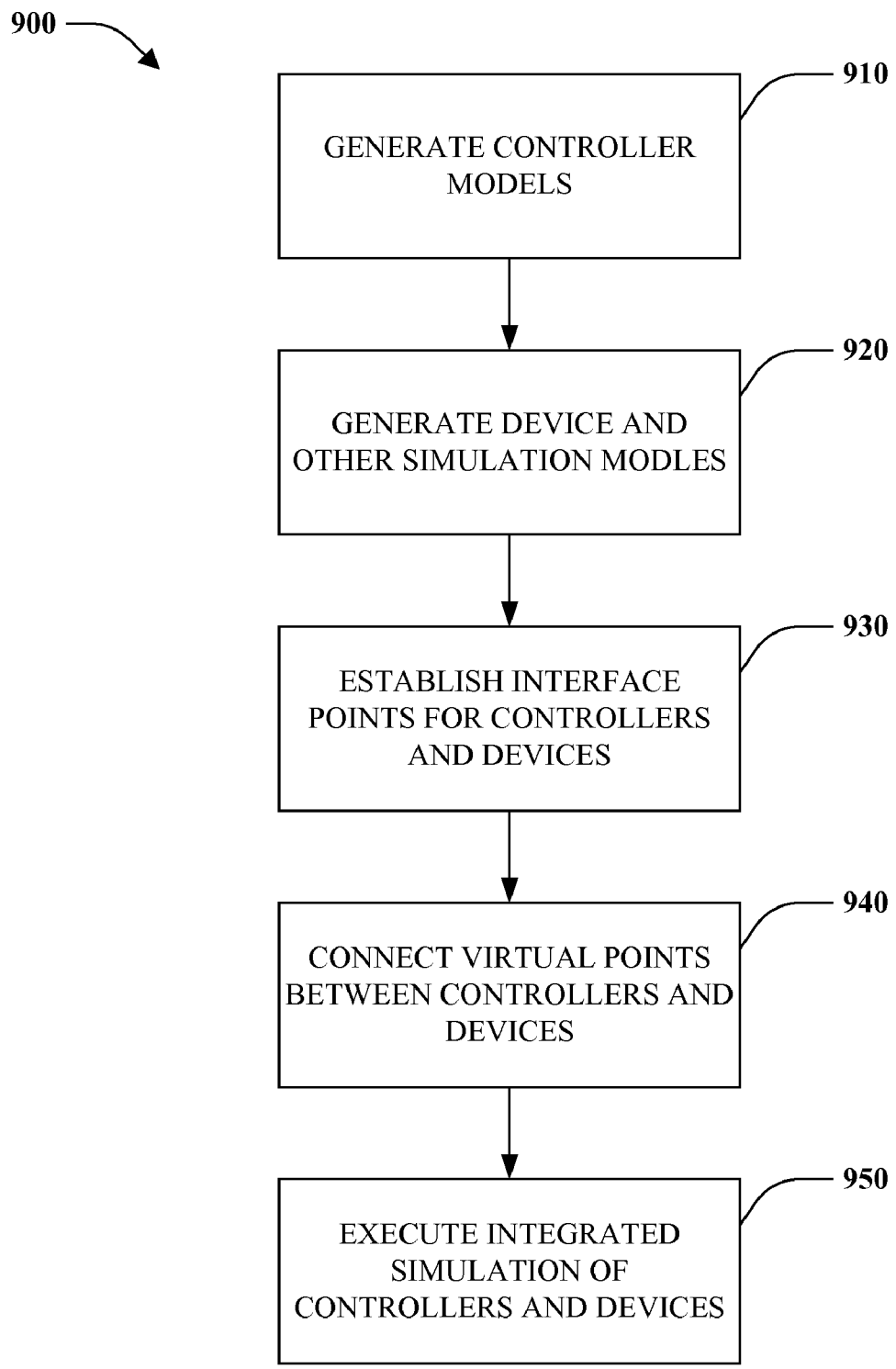
FIG. 9 is a flow diagram illustrating a methodology for generating automated suggestions.

FIG. 9 illustrates a flow diagram 900 that demonstrates a methodology for determining and providing automated suggestions. While, for purposes of simplicity of explanation, the methodology is shown and described as a series of acts, it is to be understood and appreciated that the methodologies are not limited by the order of acts, as some acts may occur in different orders or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology as described herein.

Proceeding to 910 of FIG. 9, one or more models are generated. As noted previously, such models can include device models that model performance of a given device, industry models that map characteristics of an industry to a particular control solution, and manufacturing models that consider aspects relating to equipment such as tanks, conveyors, or valves, for example. At 920, device, industry, and equipment models are determined. For example, device models can consider different device models, device performance models, suggested device parameters, device sensor data, network parameters for a device, device operating characteristics, and alternative simulations for a device. Industry models consider various nuances of a particular industry and offer suggestions based on such nuances. This can include considerations of an industry's type (e.g., beverage, automotive), industry parameters, industry profiles, throughput suggestions, equipment needs, communication considerations, and recommendations from knowledge databases for a given industry. Manufacturing models can provide resource considerations such as tank settings, manufacturing type (e.g., discrete, process), valve settings, alarm parameters, range settings, overflow data settings, and various process settings.

Proceeding to 930 of the process 900, suggestions for a particular device, industry, or equipment are mapped to an interface as a suggestion for a potential simulation. Based on the suggestions presented to the user, various simulation components are selected for a potential simulation at 940. This can include an iterative process where model suggestions are made over time and the user selects a component or parameter from the suggestion. At 950, simulations are conducted based in part on the suggestions mapped at 930. If the user selects suggested models or alter parameters in view of device, industry, or manufacturing considerations then such selections are simulated at 950.

Figure 10:
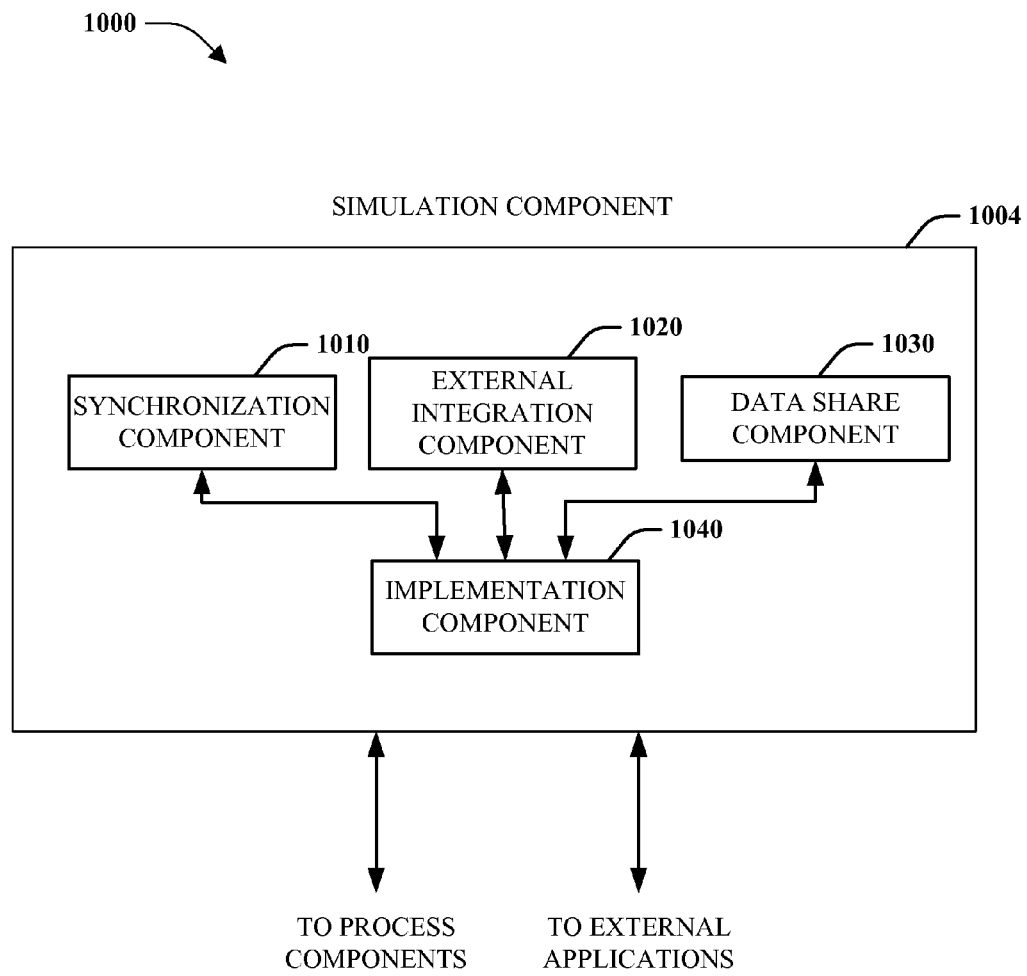
FIG. 10 is a block diagram illustrating an example simulation component and alternative simulation aspects.

Referring to FIG. 10, a block diagram of a simulation component 1004 is illustrated. The simulation component 1004 includes a synchronization component 1010, an external integration component 1020, a data share component 1030, and an implementation component 1040. The simulation component 1004 individually communicates with one or more process components to model the proper parts of the system and also with one or more external applications to receive and send data relevant to a given simulation model described above.

The simulation component 1004 can be customized for the needs of a specific system. The synchronization component 1010 enables the clock of the simulation component 1004 to be synchronized with a computer clock, or another external timekeeper. This allows the simulation component 1004 to speed up or slow down the process timing to any suitable multiple (or fraction thereof). In one example, the simulation component 1004 can slow simulation to half speed to train novice operators. In another example, the simulation component 1004 can speed up simulation to compress the testing time and reach an output result in a shorter amount of time.

The external integration component 1020 allows a user to integrate external behavior into the logic of the simulation component 1004. The communication can be established manually or automatically and can take into account, for instance, messages regarding action requests and status changes. The data share component 1030 provides the simulation component 1004 with a convenient mechanism to share data extracted from the simulation model at any point in time with other applications. Therefore, a user can upload data from the simulation component 1004 to an external evaluation application for data analysis. The external application can also automatically request or extract the data from the simulation component 1004. The information should be presented in a mutually readable format, so that translation is not required between the simulation component 1004 and the external application. After the synchronization component 1010, external integration component 1020, and data share component 1030 complete their respective configurations, the implementation component 1040 integrates those parameters into the simulation model. These parameters can be saved and labeled for future use.

The subject matter as described above includes various exemplary aspects of the subject invention. However, it should be appreciated that it is not possible to describe every conceivable component or methodology for purposes of describing these aspects. One of ordinary skill in the art may recognize that further combinations or permutations may be possible. Various methodologies or architectures may be employed to implement the subject invention, modifications, variations, or equivalents thereof. Accordingly, all such implementations of the aspects described herein are intended to embrace the scope and spirit of subject claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A tool for simulating an industrial control system, comprising:
   a simulation component that executes one or more simulation models according to a simulated execution environment; and
   a switch component associated with the simulation component that allows to selectively enable or selectively disable variability in the one or more simulation models, wherein disablement of the variability in at least one stochastic simulation model in the one or more simulation models transforms the at least one stochastic simulation model into a deterministic simulation model.

2. The tool of claim 1, the one or more simulation models are related to at least one of a device model, an industry model, or a manufacturing model.

3. The tool of claim 1, the simulation component allows randomness in the one or more simulation models to be enabled or disabled based on an application of the industrial control system.

4. The tool of claim 1, the switching component is provided as part of a user interface.

5. The tool of claim 1, the simulation component enables a manual mode and an automatic mode for testing of the one or more simulation models.

6. The tool of claim 1, the simulation component enables creating one or more expressions to allow modifications of one or more parameters returned from execution of the one or more simulation models when the variability in the one or more simulation models is disabled.

7. The tool of claim 6, at least one expression in the one or more expressions is modified programmatically through simulation instructions executed by the simulation component.

8. The tool of claim 1, the simulation component enables a user variable to be generated and tested at runtime to determine if the variability is enabled.

9. The tool of claim 1, the simulation component enables returning a calculated mean of a distribution that characterizes the variability in the one or more simulation models.

10. The tool of claim 1, the simulation component processes at least one of failure considerations, branch block instructions, or schedules.

11. The tool of claim 1, the simulation component provides a customization component to customize behavior of at least one simulation model in the one or more simulation models.

12. The tool of claim 11, the customization component allows failures to be converted to fixed failure intervals.

13. The tool of claim 11, the customization component provides options of one or more parameters to return from distributions.

14. The tool of claim 1, the simulation component provides an expression to allow modification of a parameter returned from an executed simulation model in the one or more simulation models when variability in the executed simulation model is disabled.

15. The tool of claim 1, the simulation component provides a variability factor expression.

16. The tool of claim 1, further comprising a knowledge database to store historical data related to applications, components, and systems.

17. The tool of claim 1, the simulation component includes one or more parameters relating to device parameters, instruction parameters, message parameters, network parameters, equipment parameters, or controller parameters.

18. A method of providing interface options for a simulation system, comprising:
  executing one or more simulation models according to a simulated execution environment; and
  providing simulation switches for selectively enabling, disabling, or partially disabling at least one of variability or randomness in the one or more simulation models.

19. A simulation tool for an industrial control system, comprising:
  means for collecting data relating to an industrial control system simulation or model thereof
  means for determining variability options for the industrial control system simulation or model thereof, wherein the variability options include at least one of disabling variability or enabling variability of the industrial control system simulation or model thereof; and
  means for switching the variability options for the industrial control system simulation or model thereof.

* * * * *